United States Patent
Doris et al.

(10) Patent No.: US 7,354,806 B2
(45) Date of Patent: Apr. 8, 2008

(54) SEMICONDUCTOR DEVICE STRUCTURE WITH ACTIVE REGIONS HAVING DIFFERENT SURFACE DIRECTIONS AND METHODS

(75) Inventors: Bruce B. Doris, Brewster, NY (US); Oleg Gluschenkov, Poughkeepsie, NY (US); MeiKei Ieong, Wappingers Falls, NY (US); Effendi Leobandung, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 10/711,416

(22) Filed: Sep. 17, 2004

(65) Prior Publication Data

US 2006/0060925 A1 Mar. 23, 2006

(51) Int. Cl.
*H01L 21/00* (2006.01)

(52) U.S. Cl. .................. 438/149; 438/154; 438/157; 257/E21.122

(58) Field of Classification Search ............ 438/164, 438/149, 154, 157; 257/335, 347, 67, 351
See application file for complete search history.

(56) References Cited

U.S. PATENT DOCUMENTS

| | | | | |
|---|---|---|---|---|
| 4,908,328 | A | * | 3/1990 | Hu et al. ............... 438/269 |
| 5,670,388 | A | * | 9/1997 | Machesney et al. ...... 438/164 |
| 2005/0116290 | A1 | * | 6/2005 | de Souza et al. ......... 257/347 |
| 2005/0285187 | A1 | * | 12/2005 | Bryant et al. ............ 257/335 |

* cited by examiner

*Primary Examiner*—Wai-Sing Louie
(74) *Attorney, Agent, or Firm*—Todd M.C. Li; Hoffman, Warnick & D'Alessandro

(57) ABSTRACT

Semiconductor structure and method to simultaneously achieve optimal stress type and current flow for both nFET and pFET devices, and for gates orientated in one direction, are disclosed. One embodiment of the method includes bonding a first wafer having a first surface direction and a first surface orientation atop a second wafer having a different second surface orientation and a different second surface direction; forming an opening through the first wafer to the second wafer; and forming a region in the opening coplanar with a surface of the first wafer, wherein the region has the second surface orientation and the second surface direction. The semiconductor device structure includes at least two active regions having different surface directions, each active region including one of a plurality of nFETs and a plurality of pFETs, and wherein a gate electrode orientation is such that the nFETs and the pFETs are substantially parallel to each other.

14 Claims, 6 Drawing Sheets

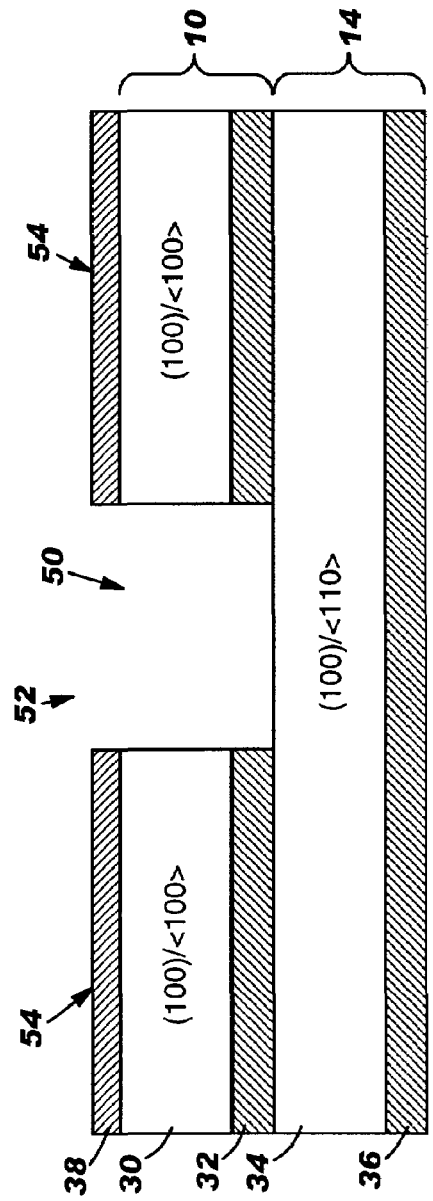
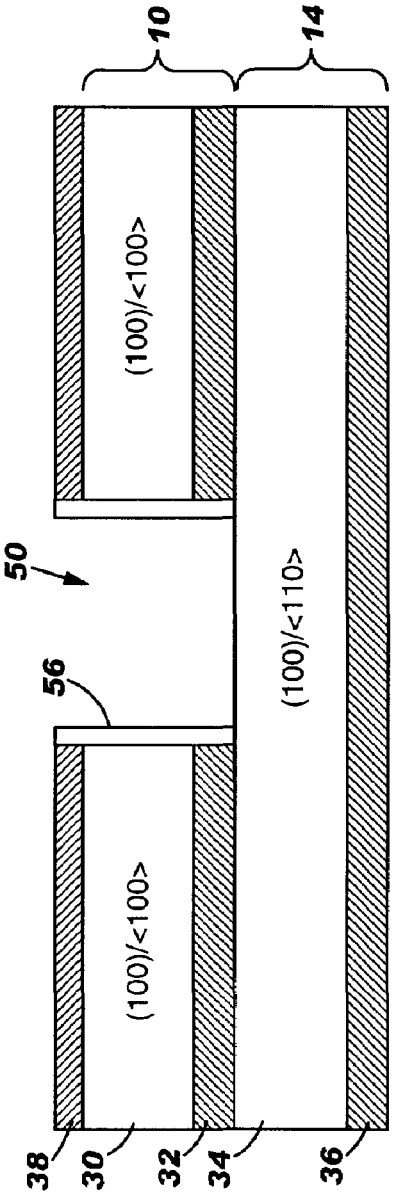

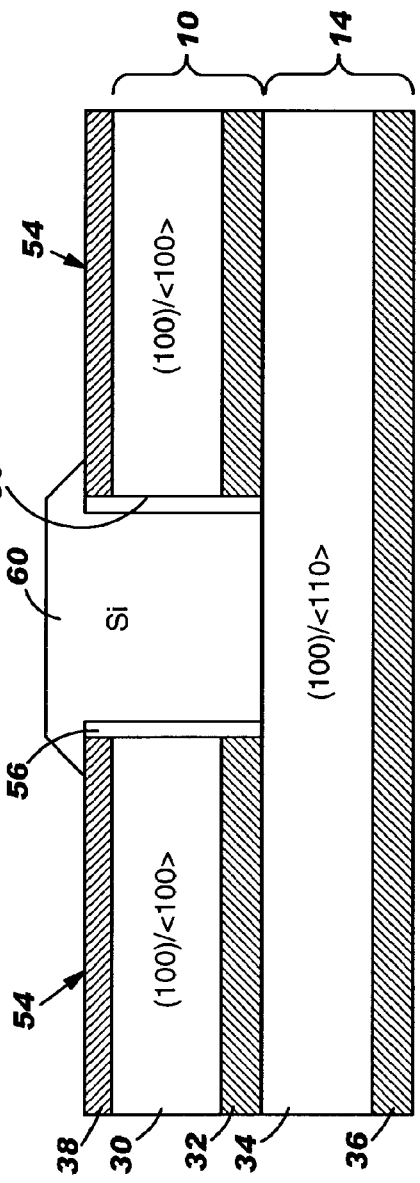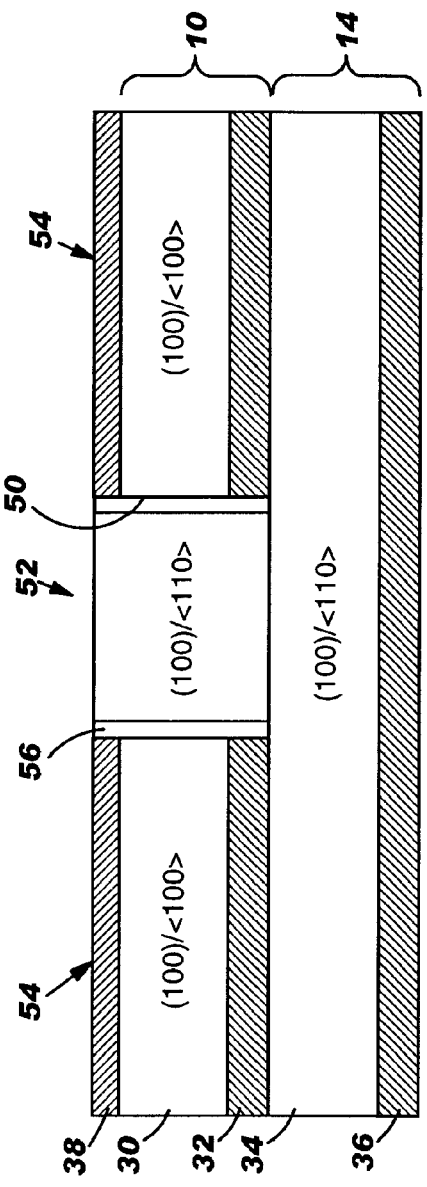

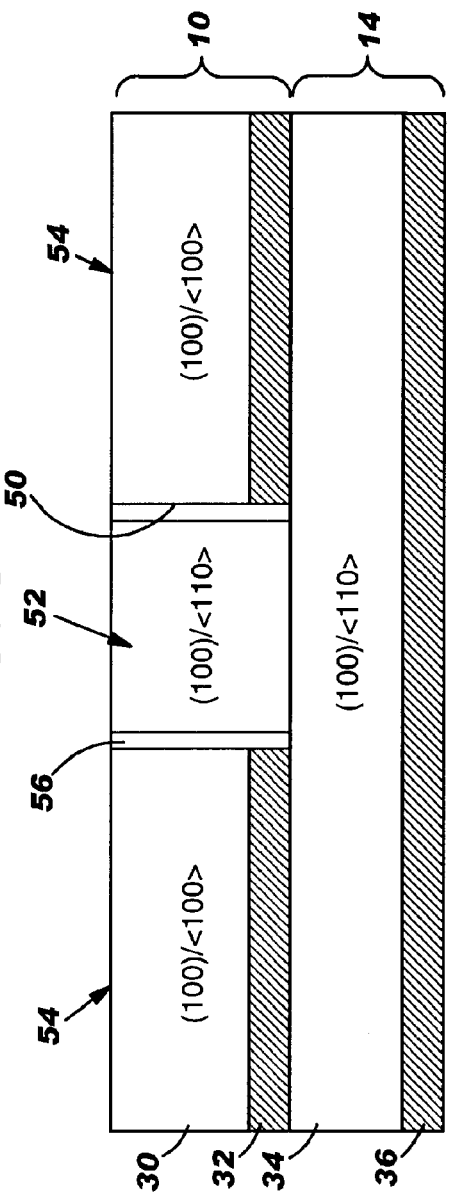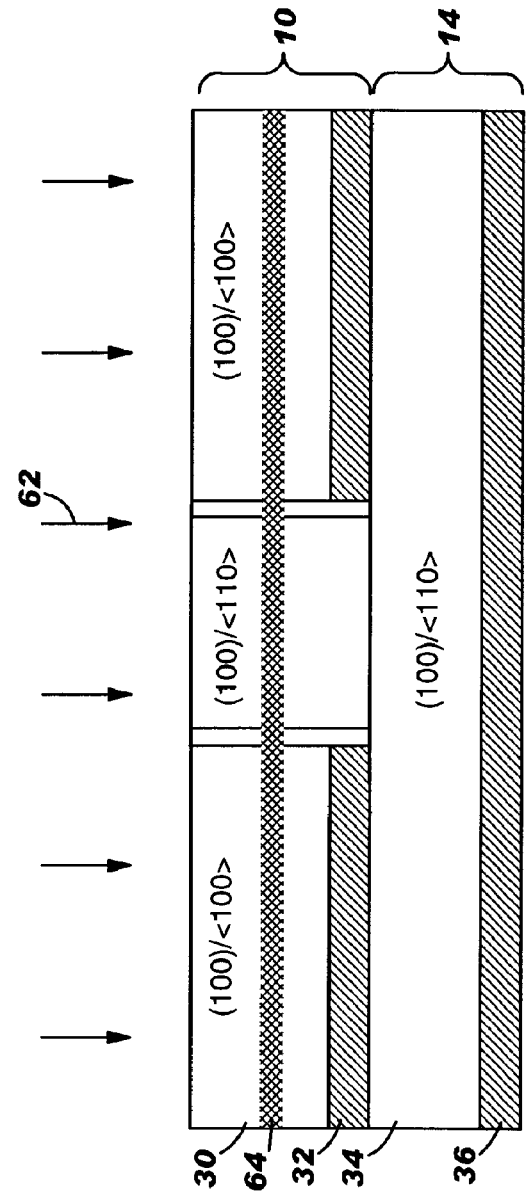

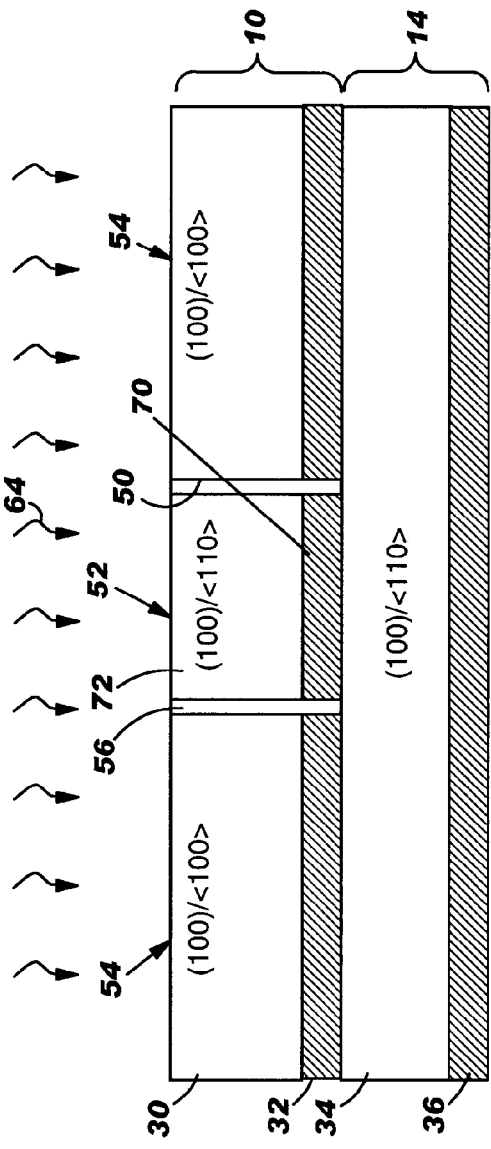
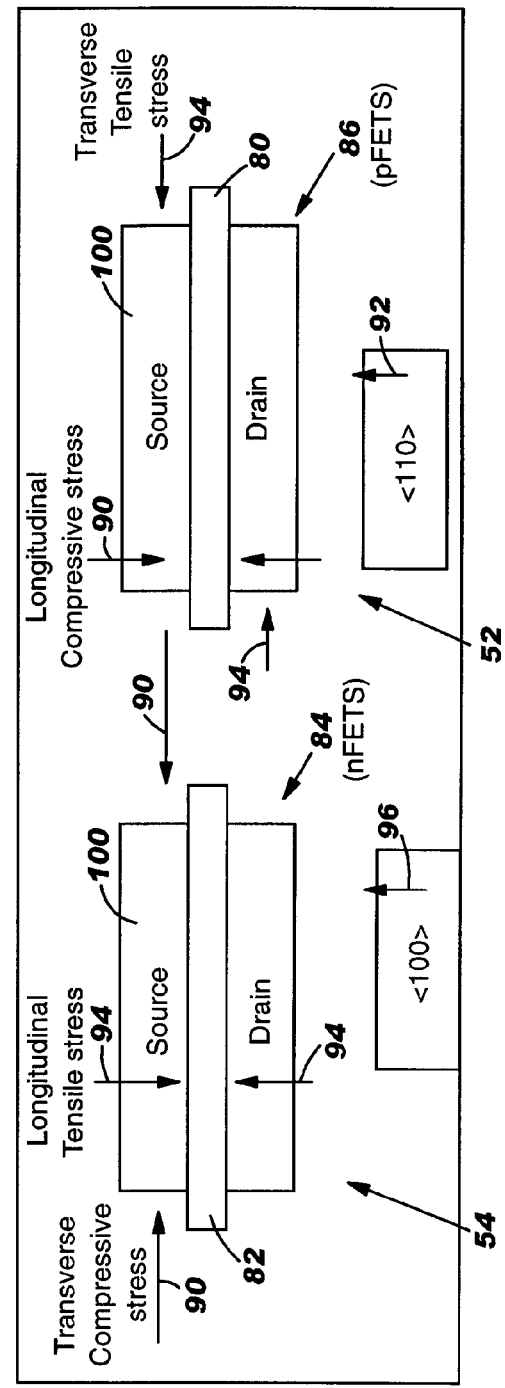

SEMICONDUCTOR DEVICE STRUCTURE WITH ACTIVE REGIONS HAVING DIFFERENT SURFACE DIRECTIONS AND METHODS

BACKGROUND OF INVENTION

The present invention relates generally to semiconductor devices, and more particularly, to a semiconductor device structure with active regions having different surface directions and local mechanical stress, and a method of forming the same.

Performance improvement of semiconductor devices is a never-ending endeavor for manufacturers of those devices. One of many mechanisms to improve performance of semiconductor devices is to apply local mechanical stress to particular devices. That is, stress that is mechanically applied to localized areas of a semiconductor device. One challenge in providing these stresses, however, is that the optimal stress type and direction relative to current flow direction is different for the two types of devices commonly used on semiconductors, i.e., n-type field effect transistors (nFETs) and p-type field effect transistors (pFETs).

In terms of current flow, conventional complementary metal-oxide semiconductor (CMOS) technologies use wafers with (100) surface orientation, and a notch in the <110> direction so that the current flow direction for nFETs and pFETs is in the <110> direction. In terms of applying mechanical stress to devices, piezoresistive coefficients have been measured for silicon (Si) with a (100) surface orientation. These measurements indicate that an optimal nFET has a current flow in the <100> direction with a tensile stress in a longitudinal direction and a compressive stress in the transverse direction relative to the current flow direction. In contrast, an optimal pFET has been found to have current flow in the <110> direction with a compressive stress in the longitudinal direction and a tensile stress in the transverse direction relative to the current flow direction. Based on these facts, applying the optimal stress type and direction relative to current flow direction is unfeasible using conventional technology.

Another challenge to achieving these optimal structures is presented by the state-of-the-art lithography requirement that gate electrodes must be oriented in a single orientation, e.g., for static random access memory (SRAM). Conventional technology does not allow achievement of both the best stress type and current flow directions, and single gate electrode orientation.

In view of the foregoing, there is a need in the art for a structure and method to simultaneously achieve the optimal stress type and direction with respect to current flow for both types of devices, and for gates orientated in one direction.

SUMMARY OF INVENTION

This invention teaches a new semiconductor structure and method to simultaneously achieve optimal stress type and current flow for both nFET and pFET devices, and for gates orientated in one direction. One embodiment of the method includes bonding a first wafer having a first surface direction and a first surface orientation atop a second wafer having a different second surface orientation and a different second surface direction; forming an opening through the first wafer to the second wafer; and forming a region in the opening coplanar with a surface of the first wafer, wherein the region has the second surface orientation and the second surface direction. The semiconductor device structure includes at least two active regions having different surface directions, each active region including one of a plurality of nFETs and a plurality of pFETs, and wherein a gate electrode orientation is such that the nFETs and the pFETs are substantially parallel to each other.

A first aspect of the invention is directed to a semiconductor device structure comprising: at least two active regions having different surface directions, each active region including one of a plurality of nFETs and a plurality of pFETs, and wherein a gate electrode orientation is such that the nFETs and the pFETs are substantially parallel to each other.

A second aspect of the invention is directed to a method of forming a semiconductor device structure, the method comprising the steps of: bonding a first wafer having a first surface direction and a first surface orientation atop a second wafer having a different second surface orientation and a different second surface direction; forming an opening through the first wafer to the second wafer; and forming a region in the opening coplanar with a surface of the first wafer, wherein the region has the second surface orientation and the second surface direction.

A third aspect of the invention is directed to a method of forming a semiconductor device structure, the method comprising the steps of: bonding a first wafer having a first surface direction and a first surface orientation atop a second wafer having a different second surface direction and a different second surface orientation; forming an opening through the first wafer to a silicon layer of the second wafer; generating a silicon in the opening to a surface of the first wafer, wherein the silicon has the different second surface orientation; forming a plurality of pFETs on the silicon, and a plurality of nFETs on another region of the first wafer, wherein gate electrodes of the FETs are substantially parallel to one another; and applying at least one of a filled trench configuration and at least one process to provide: a compressive stress in a longitudinal direction with respect to a current flow of the pFETs and a transverse direction with respect to a current flow of the nFETs; and a tensile stress in a longitudinal direction with respect to a current flow of the nFETs and a transverse direction with respect to a current flow of the pFETs.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIGS. 1-10 show a method of forming a semiconductor device structure according to the invention.

FIG. 11 shows a schematic plan view of stresses applied to a semiconductor device structure according to the invention.

DETAILED DESCRIPTION

With reference to the accompanying drawings, FIGS. 1-10 illustrate an embodiment of a method of forming a semiconductor device structure according to the invention.

Figure 1:
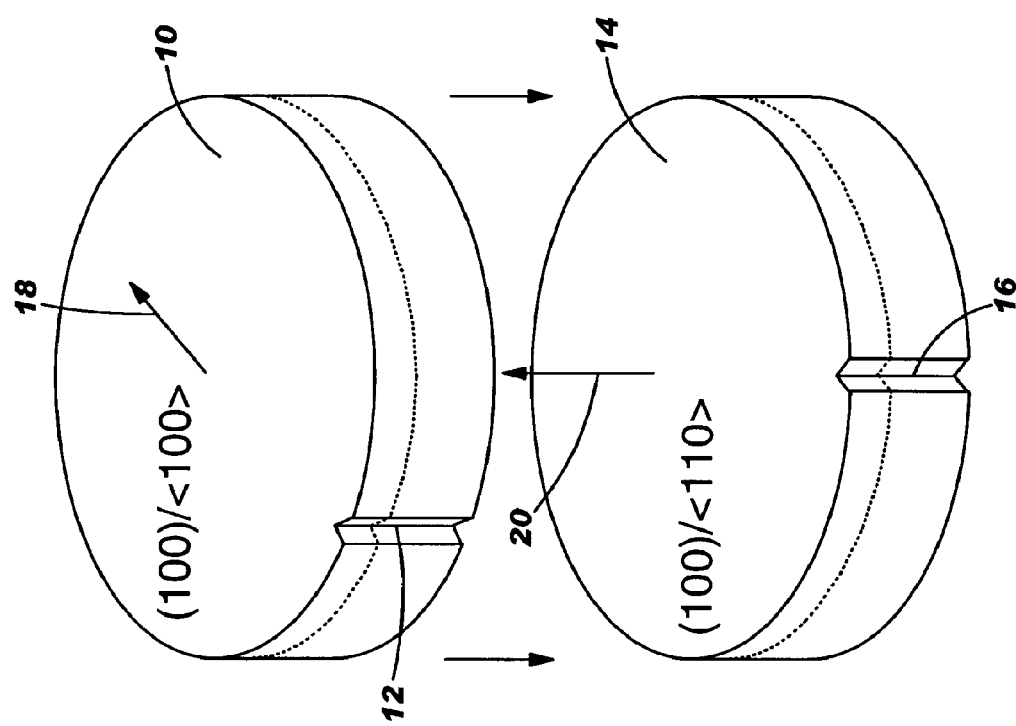
Figure 2:
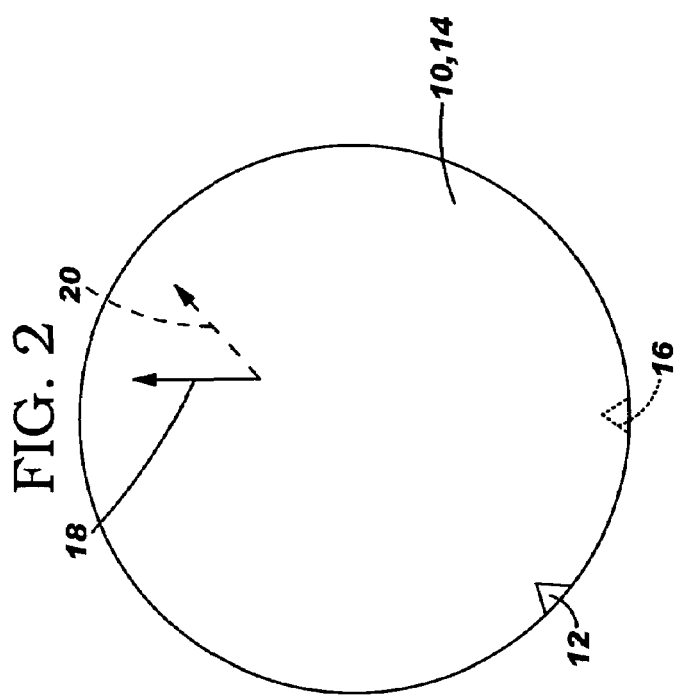

In a first step, shown in FIGS. 1 and 2, a first wafer 10 having a first surface direction, indicated by notch 12, is bonded atop a second wafer 14 having a different second surface direction, indicated by notch 16. Surface direction is also indicated by arrow 18 for wafer 10 and arrow 20 for wafer 14. As used herein, "surface direction" refers to a crystallographic direction of current flow in a surface of the silicon of a wafer, and can be denoted, as known in the art, with notations such as <100>, <110>, <111>, etc., which describe the direction of current flow in a crystal lattice. Hence, first wafer 10 is rotated, for example, 45° relative to second wafer 14 to generate the different surface directions. In a first embodiment, first wafer 10 may be positioned with notch 12 along the <100> surface direction, and second wafer 14 may be positioned with notch 16 along the <110> surface direction. In a second embodiment, first wafer 10 may have a (100) surface orientation and be positioned with notch 12 along the <110> direction, and second wafer 14 may have (110) surface orientation and may be positioned with notch 16 along the <111> surface direction. In most cases, designers will select surface directions to maximize mobility for the device and, hence, maximize performance. However, in some circumstances, surface directions may be selected to degrade mobility, i.e., hinder current flow.

As used herein, "surface orientation" refers to the crystallographic structure or periodic arrangement of silicon atoms on the surface of a wafer. In one embodiment, first and second wafers 10, 14 each have a (100) surface orientation. However, first and second wafers 10, 14 also may have different surface orientations. For example, in a second embodiment, first wafer 10 may have a (100) surface orientation and second wafer 14 may have a (110) surface orientation. In the drawings, indications for the surface direction and surface orientation for the first embodiment of each only will be made for clarity.

Figure 3:
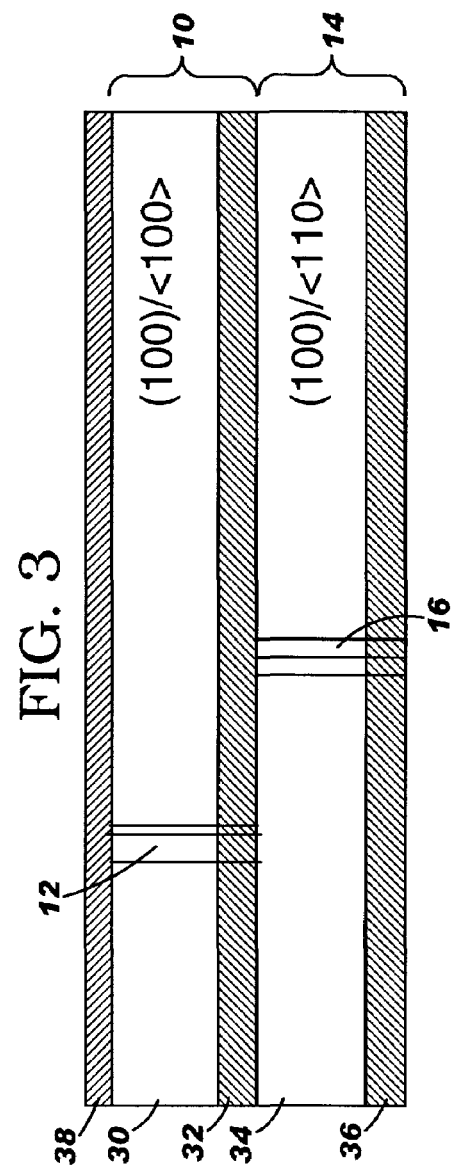

FIG. 3 shows a side view of first wafer 10 atop second wafer 14. As indicated, in one embodiment, each wafer 10, 14 is a silicon-on-insulator (SOI) type wafer. In this case, wafer 10 includes a silicon layer 30 atop an insulator layer 32, e.g., of silicon dioxide ($SiO_2$), and wafer 14 includes a silicon layer 34 atop an insulator layer 36, e.g., of silicon dioxide ($SiO_2$). As also shown, a next step may include forming pad films 38, such as a silicon dioxide ($SiO_2$) followed by silicon nitride ($Si_3N_4$), followed by a silicon nitride (SiN), on the surface of first wafer 10. Formation of pad films 38 may be by any methods now known or later developed.

In a next step, shown in FIG. 4, an opening 50 is formed through first wafer 10 to second wafer 14, and in particular, to a surface of silicon layer 34 of second wafer 14. For example, a photoresist mask (not shown) may be deposited, patterned using conventional photolithography to expose the area into which the opening is to be made, and used to etch the opening. Etching extends through pad films 38, silicon layer 30 and buried oxide layer 32, and stops on silicon layer 34 of second wafer 14. The etching chemistry can be any now known or later developed recipe used for the above-described layers, e.g., a hydrogen-bromide (HBr) based chemistry. Subsequently, the photoresist mask (not shown) is removed, for example, using an oxygen ($O_2$) ash or solvent strip. As will be described in more detail below, opening 50 is made in a region 52 to include later-generated pFETs, and other regions 52 will include nFETs.

FIG. 5 shows an additional aspect of the opening forming step, in which a sidewall spacer 56 is formed along opening 50 to protect the sidewall of first wafer 10, i.e, SOI layer 30, 32. Spacer 56 may include any common spacer material, for example, silicon dioxide ($SiO_2$), silicon nitride (SiN), etc.

FIGS. 6-8 show a next step of forming region 52 (FIG. 7) in opening 50. In one embodiment, this step includes conducting a pre-clean followed by growth of a selective epitaxial silicon (Si) 60 to form region 52. As indicated in FIG. 6, epitaxial layer 60 may be grown slightly higher than first wafer 10, i.e., SOI layer 30, 32 to ensure sufficient final thickness of layer 60. Accordingly, this step may also include planarizing epitaxial layer 60 to pad films 38, as shown in FIG. 7, so that both regions of different surface directions are approximately coplanar. Planarization may then proceed to the surface of wafer 10, as shown in FIG. 8, after pad films 38 have been removed. As will be recognized, epitaxial layer 60 of silicon results in region 52 having second surface direction and orientation of silicon layer 34, i.e., (100) surface orientation and <110> surface direction.

Turning to FIGS. 9-10, the next steps include implanting 62 oxygen 64, as shown in FIG. 9, followed by an annealing to form a buried oxide layer 70, as shown in FIG. 10, in region 52. Buried oxide layer 70 in region 52 is substantially parallel to, and of approximately equal dimensions, as insulator layer 32 on the initial first wafer 10 (FIG. 3). The resulting semiconductor device structure includes region 52 having an SOI formation with silicon layer 72 and buried oxide layer 70 and a surface direction of <110> and another region 54 having an SOI formation with silicon layer 30, and insulator layer 32 and/or 70 and a surface direction of <100>.

Subsequent to the above steps, FET processing proceeds to generate a plurality of first type gate electrodes 80 (pFETs 86) on region 52, and a plurality of second type gate electrodes 82 (nFETs 84) on another region 54 of first wafer 10, in any now known or later developed fashion. In any event, as shown in FIG. 11, the invention allows all of the gate electrodes 80, 82 to be generated substantially parallel to one another in accordance with state-of-the-art photolithography techniques. The FET processing also includes application of stresses to nFETs 84 and pFETs 86 generated. Since many variations of the FET processing may be used, none will be illustrated, however, one illustrative embodiment will now be described cursorily below.

In a first step, an isolation process may be implemented to isolate pFETs 86 from nFETs 84 by generating a silicon trench isolation (STI) stress configuration. The isolation process may include using two mask steps. A first mask step (i.e., lithography and etch) is used to open trenches in the direction parallel to current flow for the pFETs (to be formed later) and perpendicular to current flow for the nFETs (to be formed later). A compressive material such as silicon dioxide ($SiO_2$) or silicon nitride (SiN) is used to fill the trenches. Next, the second mask step is used to etch trenches parallel to the current flow for the nFETs (to be formed later) and trenches perpendicular to the current flow for the pFETs (to be formed later). These trenches are filled with a tensile material such as silicon dioxide ($SiO_2$) or silicon nitride (SiN). The resulting stresses are, as shown in FIG. 11, as follows: a compressive stress 90 in a longitudinal direction with respect to a current flow 92 of pFETs 86 and a transverse direction with respect to a current flow 96 of nFETs 84; and a tensile stress 94 applied in a longitudinal direction with respect to a current flow 96 of nFETs 84 and a transverse direction with respect to a current flow 92 of pFET 86.

At this point in the process, as known in the art, wells (if used) may be implanted and annealed. Next, a gate dielectric may be formed followed by gate electrode patterning. As noted above, one aspect of this invention is that all gate electrodes are orientated in the same direction, as shown in FIG. 11. In other words, the gate electrodes are patterned such that they are all substantially parallel to each other. As also noted above, in a first embodiment, the direction of current flow 96 for nFETs is in the <100> surface direction (first wafer 10), while current flow 92 for pFETs is in the <110> surface direction (region 52). Alternatively, in a second embodiment, the surface orientation is (110) and the direction of current flow is <111> for pFETs while the surface orientation is (100) and the current flow direction is <110> for nFETs. Although two embodiments have been mentioned herein, it should be recognized that other surface directions are possible depending on the application. Accordingly, the invention should not be limited to any particular configuration other than as denoted in the attached claims.

After gate patterning, halos and source/drain (S/D) region extensions 100 may be implanted. S/D spacers may then be formed and S/D implantation conducted. A rapid thermal anneal (RTA) or other annealing process is completed to activate the junctions. Silicide is then formed on the S/D and gate regions to create low resistance contacts.

To provide further stress, either in addition to the above-described isolation process that generates a STI stress configuration, or as an alternative, at least one process may be conducted to the entire wafer (10 and 14). In one embodiment, application of at least one film is conducted. For example, to produce tensile stress in the longitudinal direction for the nFETs, a tensile film may be applied. The tensile film is removed from the pFET region 52 using a block mask and litho process. A compressive film may then be applied to the entire wafer in order to produce compressive stress in the longitudinal direction for the pFET. The compressive film is removed by dry or wet etch from the nFET region 54. Once again, the resulting stresses are, as shown in FIG. 11, as follows: a compressive stress 90 in a longitudinal direction with respect to a current flow 92 of pFETs 86 and a transverse direction with respect to a current flow 96 of nFETs 84; and a tensile stress 94 applied in a longitudinal direction with respect to a current flow 96 of nFETs 84 and a transverse direction with respect to a current flow 92 of pFET 86.

It should be recognized that the description above presents one possible set of stressors applied along the preferred directions for each device. Other choices or methods of applying stress in the specified directions for the particular devices are also possible. For example, the stress may be produced by any combination of gate silicon trench isolation (STI) stress, film stress or any other type of uni-axial stress.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a semiconductor device structure, the method comprising the steps of:
    bonding a first wafer having a first surface direction atop a second wafer having a different second surface direction; the first wafer including a buried oxide layer;
    forming an opening through the first wafer to the second wafer;
    forming a region in the opening coplanar with a surface of the first wafer, wherein the region has the second surface direction;
    implanting an oxygen; and
    annealing to re-form the buried oxide layer in the region that was removed when the opening was formed.

2. The method of claim 1, further comprising the step of forming a first type gate electrode on the region, and a second type gate electrode on another region of the first wafer, and all of the gate electrodes are substantially parallel to one another.

3. The method of claim 2, wherein the first gate electrode includes a nFET, and the second gate electrode includes an nFET.

4. The method of claim 3, further comprising the step of applying at least one of a filled trench configuration and at least one film to provide:
    a compressive stress in a longitudinal direction with respect to a current flow of the pFET and a transverse direction with respect to a current flow of the nFET; and
    a tensile stress applied in a longitudinal direction with respect to a current flow of the nFET and a transverse direction with respect to a current flow of the pFET.

5. The method of claim 1, wherein each wafer includes a silicon layer on an insulator layer, and the opening forming step includes forming the opening to the silicon layer of the second wafer.

6. The method of claim 5, wherein the region forming step includes epitaxially growing silicon in the opening, and planarizing the silicon.

7. The method of claim 1, wherein the opening forming step includes forming a sidewall spacer along the opening.

8. The method of claim 1, wherein the first surface direction is a <100> surface direction and the second surface direction is a <110> surface direction.

9. The method of claim 1, wherein the first surface direction is a <110> surface direction and the second surface direction is a >111> surface direction.

10. The method of claim 1, wherein the first wafer has a first surface orientation and the second wafer has a different second orientation, and the region has the second surface orientation.

11. The method of claim 1, wherein the first surface direction and the second surface direction are selected to degrade mobility.

12. A method of forming a semiconductor device structure, the method comprising the steps of
    bonding a first wafer having a first surface direction and a first surface orientation atop a second wafer having a different second surface direction and a different second surface orientation; the first wafer including a buried oxide layer;
    forming an opening through the first wafer to a silicon layer of the second wafer;
    generating a silicon in the opening to a surface of the first wafer, wherein the silicon has the different second surface orientation;
    forming a plurality of pFETs on the silicon, and a plurality of nFETs on another region of the first wafer, wherein gate electrodes of the FETs are substantially parallel to one another;
    applying at least one of a filled trench configuration and at least one process to provide:
        a compressive stress in a longitudinal direction with respect to a current flow of the pFETs and a transverse direction with respect to a current flow of the nFETs; and
        a tensile stress in a longitudinal direction with respect to a nFETs and a transverse direction with respect to a current flow of the pFETs;
    implanting oxygen; and
    annealing to re-form the buried oxide layer prior to the FET forming step in the region that was removed when the opening was formed.

13. The method of claim 12, wherein each wafer includes a silicon layer on an insulator layer, and the opening forming step includes forming the opening to the silicon layer of the second wafer.

14. The method of claim 12, wherein the region generating step includes epitaxially growing silicon in the opening, and planarizing the silicon, and the opening forming step further includes forming a sidewall spacer along the opening.

* * * * *